(12) United States Patent
Sanchez et al.

(10) Patent No.: US 11,758,683 B2
(45) Date of Patent: Sep. 12, 2023

(54) MODULAR SWITCH RACK

(71) Applicants: Sebastian Sanchez, Houston, TX (US); Cole Attaway, Houston, TX (US)

(72) Inventors: Sebastian Sanchez, Houston, TX (US); Cole Attaway, Houston, TX (US)

(*) Notice: Subject to any disclaimer, the term of this patent is extended or adjusted under 35 U.S.C. 154(b) by 285 days.

(21) Appl. No.: 17/099,502

(22) Filed: Nov. 16, 2020

(65) Prior Publication Data
US 2022/0159865 A1 May 19, 2022

(51) Int. Cl.
*H05K 7/18* (2006.01)

(52) U.S. Cl.
CPC .................... *H05K 7/183* (2013.01)

(58) Field of Classification Search
CPC ................ H05K 7/183; H05K 7/18
See application file for complete search history.

(56) References Cited

U.S. PATENT DOCUMENTS

| | | | |
|---|---|---|---|
| D183,645 S | 10/1958 | Blum | |
| 3,057,601 A * | 10/1962 | Simpson | E01F 13/02 256/64 |
| 3,375,406 A * | 3/1968 | Alden | H05K 7/18 174/68.3 |
| 3,655,254 A | 4/1972 | Mayer | |
| 3,755,716 A * | 8/1973 | Yoshii | H04Q 1/021 361/829 |
| 4,017,134 A | 4/1977 | Lenglin | |
| 4,261,470 A | 4/1981 | Dolan | |
| 4,390,103 A * | 6/1983 | Husband | A47B 57/30 403/274 |
| 4,426,011 A * | 1/1984 | Jay | A47B 96/061 211/193 |
| 6,202,570 B1 * | 3/2001 | Kurtsman | H04Q 1/08 211/187 |
| 6,425,648 B1 * | 7/2002 | Notohardjono | H02B 1/301 312/265.4 |
| 6,481,582 B1 * | 11/2002 | Rinderer | H05K 7/183 361/679.02 |
| 8,743,549 B2 * | 6/2014 | Frink | G06F 1/20 361/679.5 |
| 9,131,618 B2 | 9/2015 | Peterson | |
| 9,516,781 B2 * | 12/2016 | Ray | G02B 6/4455 |
| 9,591,784 B2 * | 3/2017 | Butterbaugh | H05K 7/1488 |
| 9,974,203 B1 | 5/2018 | Ho | |
| 10,470,335 B2 | 11/2019 | Gupta | |
| 2003/0071002 A1 * | 4/2003 | Hung | H05K 7/183 211/183 |
| 2005/0117309 A1 | 6/2005 | Rieken | |
| 2006/0274508 A1 | 12/2006 | LaRiviere | |
| 2012/0019117 A1 | 1/2012 | Dunwoody | |
| 2017/0245390 A1 | 8/2017 | Larson | |
| 2018/0027701 A1 * | 1/2018 | Kam | H05K 7/1485 454/184 |

FOREIGN PATENT DOCUMENTS

| | | |
|---|---|---|
| EP | 3280232 | 2/2018 |
| WO | 2015102688 | 7/2015 |

* cited by examiner

*Primary Examiner* — Bayan Salone
(74) *Attorney, Agent, or Firm* — BUCHE & ASSOCIATES, P.C.; Bryce A. Johnson; John K. Buche

(57) ABSTRACT

Disclosed are methods and apparatus for a modular field switch rack.

5 Claims, 20 Drawing Sheets

MODULAR SWITCH RACK

CROSS-REFERENCE TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

REFERENCE TO AN APPENDIX SUBMITTED ON A COMPACT DISC AND INCORPORATED BY REFERENCE OF THE MATERIAL ON THE COMPACT DISC

Not applicable.

STATEMENT REGARDING PRIOR DISCLOSURES BY THE INVENTOR OR A JOINT INVENTOR

Reserved for a later date, if necessary.

BACKGROUND OF THE INVENTION

Field of Invention

The disclosed subject matter is in the field of devices, structures, and methodologies for mounting switch racks outdoors.

Background of the Invention

Oil is one of the most important natural resources found on earth. Oil derives considerable value from its utility and finitude. Nearly everyone uses some type of crude oil derived product on a regular basis. Large entities and systems also rely heavily on crude oil products, such as the transportation industry, the military, supply chains, and power plants, among many others.

Broadly speaking, oil harvesting operations consist of a multistep process of locating an oil field, drilling an oil well, and extracting and recovering the oil. After recovery, the oil is refined downstream where it may be turned into different products such as gasoline, distillate fuels, polymer feedstocks, chemical feedstocks, or synthetic materials.

In modern times, computers may be used during nearly every step of the harvesting and production processes. Computers may be used to is gather and process seismic information during exploration, to control the speed, force, and depth of a drill when drilling a well, or during downstream processing. Inherently, computers rely on IT infrastructure to support them. This infrastructure may include servers, switches, storage subsystems, networking devices, routers, or cabling. Certain structures such as tables, mounts, or switch racks may be required to serve as frames or enclosures for the IT infrastructure.

Oil wells are often set up in remote areas. This involves bringing in and setting up all the necessary equipment, such as drills, trucks, computers, and IT infrastructure, to the remote area. Some of the necessary equipment is designed for use in outdoor remote areas, however other equipment is not. Obviously, drills, platforms, encampments, and vehicles are designed for outdoor use and inhospitable conditions. Generally, computers, IT infrastructure, and the structures which support them are not designed for outdoor use or use in remote areas. Most structures for IT infrastructure, particularly switch racks which are frames for servers, telecommunications equipment, or networking hardware, are designed to be installed in offices or data centers. Oil platforms which are often built in the desert, tundra, or ocean are inhospitable environments which may take a toll on the computers, their infrastructure, and the like.

Often switch racks are non-modular, not durable, or not graded for outdoor use by design. Such switch racks were originally designed for use indoors in the world of telephony or railroad signaling. Now, they are designed for use in data centers. In all cases, switch racks are intended to be used indoors in a cool dry environment. Because of their intended use in temperate environments these switch racks are not ideal for well site use and often fail to achieve their intended purpose onsite. They fail to protect the servers or telecommunications equipment from the extreme environment. They are often cumbersome to transport and build. Further, they may be hard or nearly impossible to set up in the field due to a lack of adequate wall or floor material to anchor the switch rack into. Thus, a need exists for a modular, durable, field switch rack.

LISTING OF RELATED ART

The prior art might include the following:

U.S. Pat. No. 6,202,570 by Kurtsman circa 2001 discloses a, "communications equipment relay rack."

U.S. Pat. No. 9,516,781 by Ray circa 2016 discloses a, "fiber optic shelf with a removable roof panel."

U.S. Pat. No. 6,481,582 by Rinderer circa 2002 discloses a, "rack."

U.S. Pat. No. 177,897 by Thomas circa 1876 discloses a "portable fence."

U.S. Pat. No. 3,057,601 by Simpson circa 1959 discloses a "portable highway barrier."

D183645 by Blum circa 1958 discloses a, "railing unit."

U.S. Pat. No. 3,375,406 by Alden circa 1966 discloses an, "electrical harness."

U.S. Pat. No. 3,755,716 by Yoshi circa 1973 discloses an "equipment frame for electrical elements."

U.S. Pat. No. 4,390,103 by Husband circa 1938 discloses a, "shelving system."

U.S. Pat. No. 9,131,618 by Peterson circa 2015 discloses a "modular equipment rack system for data center."

US20170245390 by Larson circa 2016 discloses, "off center component racking."

WO2015102688 by Baily circa 2015 discloses a, "modular, scalable, expandable, rack-based information handling system."

EP3280232 by Ziegler circa 2018 discloses, "a modular rack system."

U.S. Pat. No. 9,591,784 by Butterbaugh circa 2017 discloses multiple-backplane implements for modular platforms.

US20050117309 by Rieken circa 2005 discloses a, "server rack."

US20060274508 by LaRiviere circa 2006 discloses a "computer rack mounting system."

US20120019117 by Dunwoody circa 2012 discloses a, "universal is rack cable management system."

U.S. Pat. No. 8,743,549 by Frink circa 2014 discloses a, "modular mass storage system."

U.S. Pat. No. 9,974,203 by Ho circa 2018 discloses a, "racking system for supporting a computing device."

U.S. Pat. No. 10,470,335 by Gupta circa 2019 discloses a, "configurable module guides for modular electronic system."

U.S. Pat. No. 3,655,254 by Mayer circa 1972 discloses a, "cabinet, particularly for electrical installations."

U.S. Pat. No. 4,261,470 by Dolan circa 1981 discloses a, "collapsible rack."

U.S. Pat. No. 4,017,134 by Lenglin circa 1977 discloses a, "rack-mounting for electronic equipment."

SUMMARY OF THE INVENTION

In view of the foregoing, an object of this specification is to disclose a modular switch rack.

In view of the foregoing, an object of this specification is to disclose a durable switch rack.

In view of the foregoing, an object of this specification is to disclose a field switch rack.

In view of the foregoing, an object of this specification is to disclose a varying length switch rack.

In view of the foregoing, an object of this specification is to disclose a bolted switch rack.

In view of the foregoing, an object of this specification is to disclose a switch rack which houses and weather protects various controls and switches for site equipment.

In one embodiment, the disclosed subject matter is a varying length, modular, and bolted switch rack. In use, a switch rack may be delivered to, and setup at oil harvesting sites where the rack houses and weather-protects various controls and switches for on-site equipment. The switch racks may be shipped as modular, to-order sizes, and rapidly assembled at the jobsite.

Other objectives of the invention will become apparent to those skilled in the art once the invention has been shown and described. These objectives are not to be construed as limitations of applicant's invention but are merely aimed to suggest some of the many benefits that may be realized by the apparatus of the present application and with its many embodiments.

BRIEF DESCRIPTION OF THE SEVERAL VIEWS OF THE DRAWINGS

Other objectives of the disclosure will become apparent to those skilled in the art once the invention has been shown and described. The manner in which these objectives and other desirable characteristics can be obtained is explained in the following description and attached figures in which.

In the figures each component of the mount shown in the figures is labeled and indicated by the numeral as shown on the list below;

1—switch rack;
1*a*—bolt;
1*b*—nut;
2—upper;
3—vertical bar;
3*a*—vertical bar holes;
3*b*—notch;
4—base plate;
4*a*—base plate holes;
5—horizontal bar;
5*a*—horizontal bar holes;
6—strut;
6*a*—strut holes;
7—inner strut;
7*a*—inner strut holes;
8—slope bar;
9—lower;
10—loop;
11—wedge;
11*a*—wedge holes;
12—attachment plate;
12*a*—attachment plate holes;
13—temporary lifting lugs;
14—roofing panels; and,
15—concrete piers.

It is to be noted, however, that the appended figures illustrate only typical embodiments of this invention and are therefore not to be considered limiting of its scope, for the invention may admit to other equally effective embodiments that will be appreciated by those reasonably skilled in the relevant arts. Also, figures are not necessarily made to scale but are representative.

DETAILED DESCRIPTION OF PREFERRED EMBODIMENTS

In one embodiment, the disclosed subject matter is a varying length, modular, and bolted switch rack 1. In use, a switch rack may be delivered to, and setup at oil harvesting sites where the rack houses and weather-protects various controls and switches for on-site equipment. The switch racks may be shipped as modular, to-order sizes, and rapidly assembled at the jobsite.

The more specific details of the preferred embodiment are described with relevance to the figures.

Figure 1:
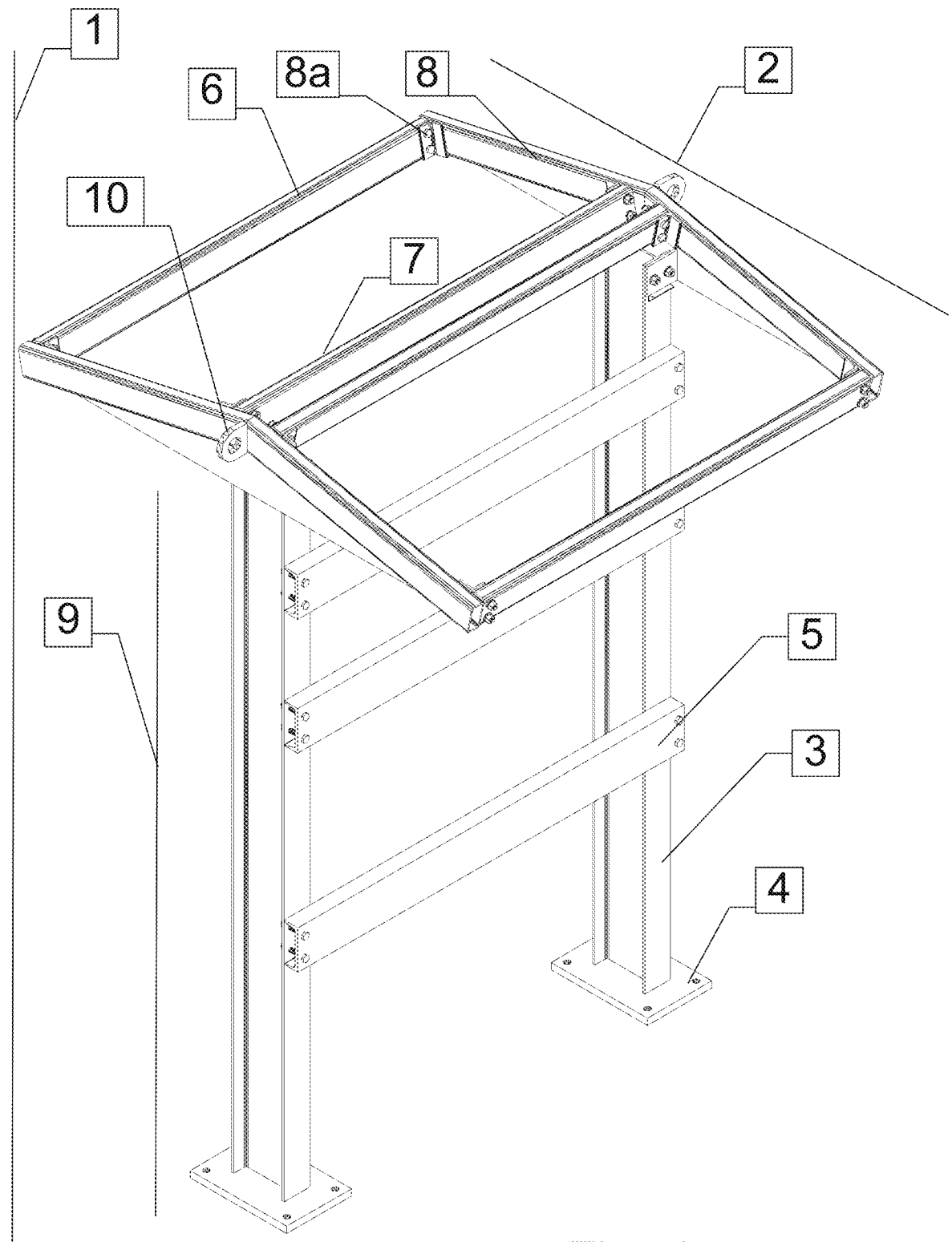
FIG. 1 is a perspective view of a preferred embodiment of a switch rack 1.
Figure 6:
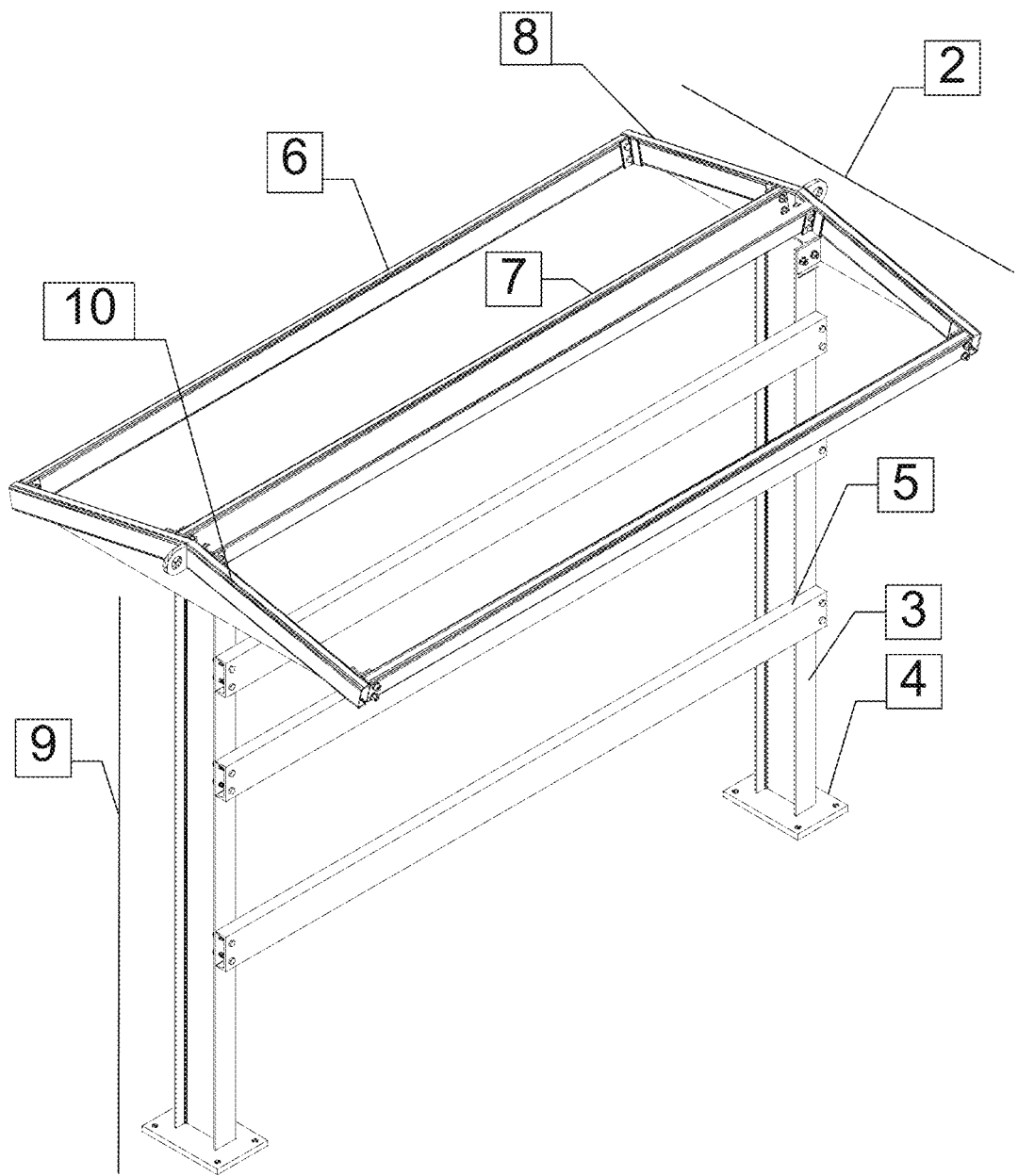
FIG. 6 is a perspective view of an alternate embodiment of the switch rack.

FIGS. 1 & 6 are perspective views of the switch rack 1. FIG. 1 shows an embodiment with a shorter plurality of horizontal components. FIG. 6 shows an alternate embodiment with longer horizontal components. Specifically, there are differences in the lengths of a plurality horizontal bars 5, a plurality of inner struts 7, and a plurality of struts 6. However, these sizes are not intended to be limiting. This application speaks to horizontal components of all sizes. The switch rack 1 can be made to order so sizes of all components can be customized for different customers and their intended use of the switch rack 1. Regardless, both switch racks 1 may be comprised of an upper part 2 and a lower part 9. The upper part 2 may be comprised of a plurality of struts 6, a plurality of inner struts 7, a plurality of slope bars 8, a plurality of loops 10, a plurality of nuts 1b and a is plurality of bolts 1a. The lower 9 may be comprised of horizontal bars 5, vertical bars 3, and a plurality of base plates 4 which are attached to the vertical bars 3. The horizontal bars 5 may preferably be c-channel bars or alternatively I-beams. The vertical bars 3 may preferably be I beams or alternatively c-channel bars. These bars may be constructed out of a metal or an alloy such as aluminum. The bars of both the upper 2 and the lower 9 may be attached by using threaded nuts 1b and bolts 1a to mate different bars together.

Figure 2:
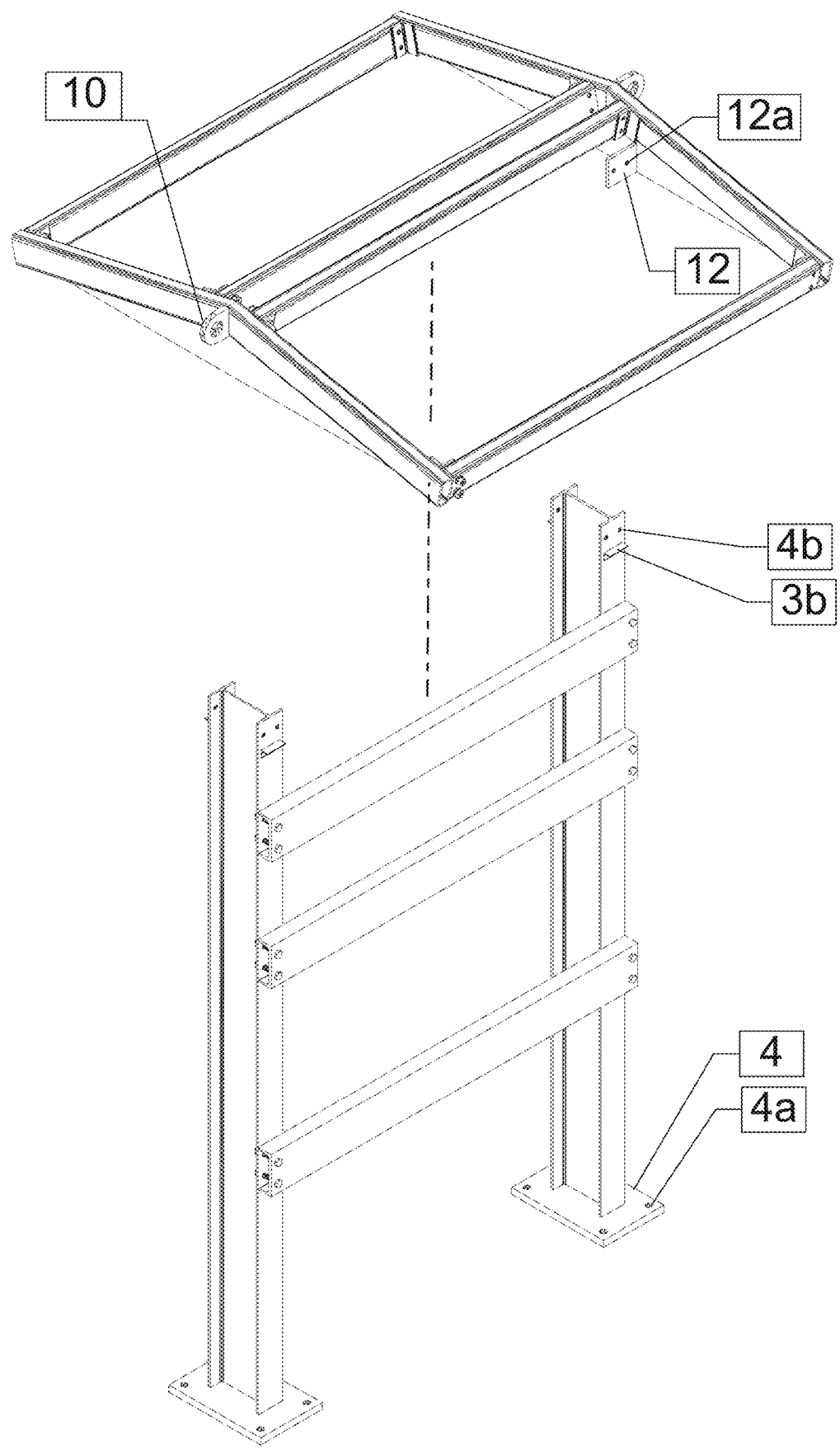
FIG. 2 is an exploded view of the switch rack.
Figure 7:
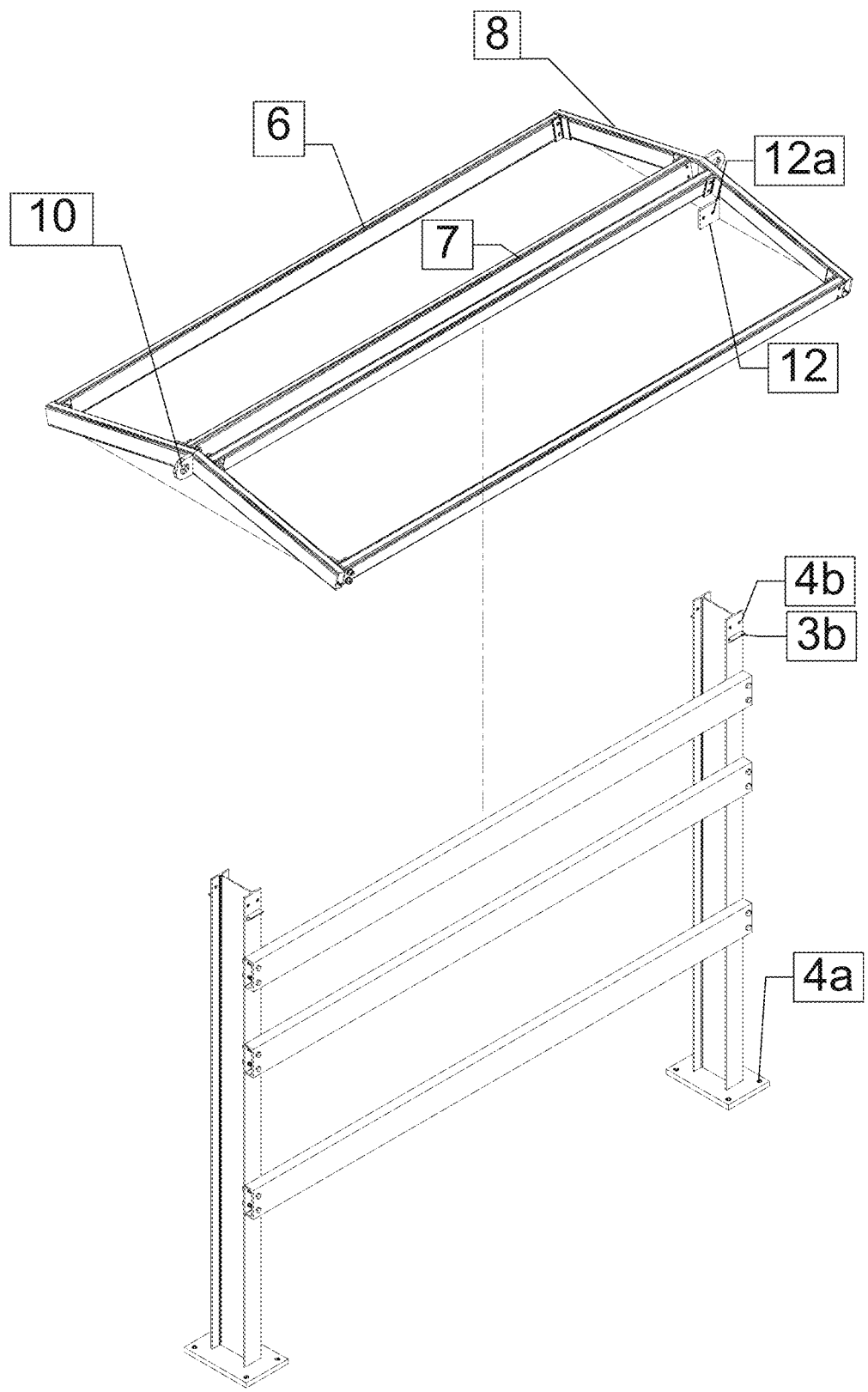
FIG. 7 is an exploded view of the alternate embodiment of the switch rack.

FIGS. 2 & 7 are exploded views of the switch rack 1. FIG. 2 shows an embodiment with a shorter plurality of horizontal components (e.g., like the switch rack shown in FIG. 1). FIG. 7 shows an alternate embodiment with longer horizontal components (e.g., like the switch rack 1 of FIG. 6. As shown in either embodiment, the switch rack 1 may be characterized by horizontal parts such as the horizontal bar 5, strut 6, and inner strut 7. Worth noting, is that both switch racks 1 in FIGS. 2 & 7 show the upper removed from the lower 9.

As shown and described in this application the switch rack 1 is suitably easy to assemble and modular. The upper part 2 is mated to the lower part 9 by lowering the upper part 2 onto the lower part 9. Once in place, an attachment plate 12 featuring two holes is placed parallel to the is vertical bar 3. Both the vertical bar 3 and the attachment plate 12 feature at least one attachment plate hole 12a, and at least one vertical bar hole 3a. The holes may be cooperative and correspondent of each other. In one mode or embodiment, there is a plurality of holes 12a & 3a within both parts, i.e., the vertical bar 3 and the attachment plate 12, and each part has cooperative and correspondent hole layouts. Suitably, the base of the attachment plate 12 may also sit upon a notch 3b. The notch 3b may protrude outward from the top of the vertical bar 3. The notch 3b may be useful in aligning the attachment plate 12 and the vertical bars 3, and constructing the switch rack 1. Once the holes 12a & 3a are aligned, the bolts 1a may be passed through both holes. Once the bolt 1a is in place a nut 1b may be screwed to the bolt 1a matting the upper 2 and lower 9.

Figure 3:
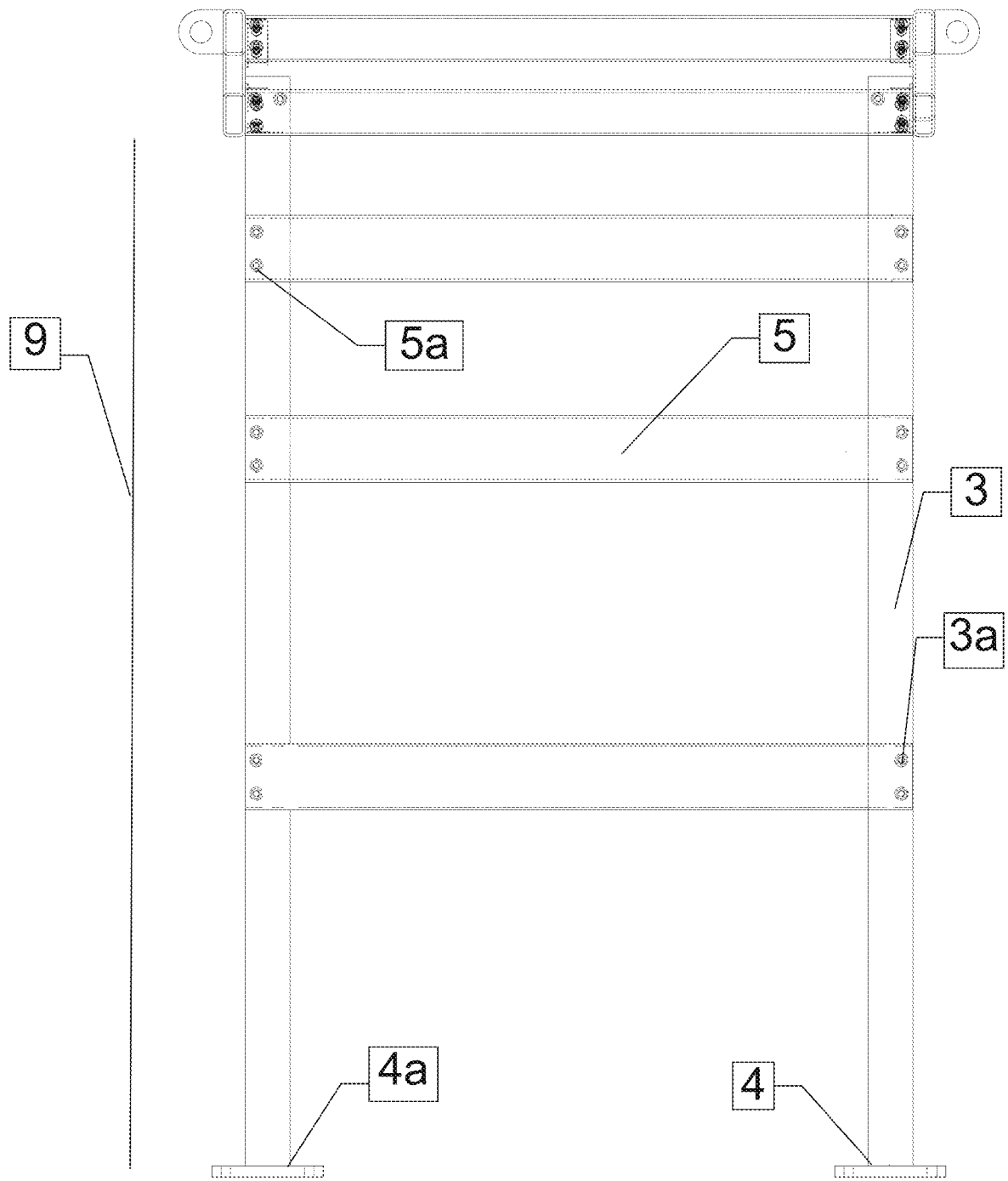
FIG. 3 is a front view of the switch rack.
Figure 8:
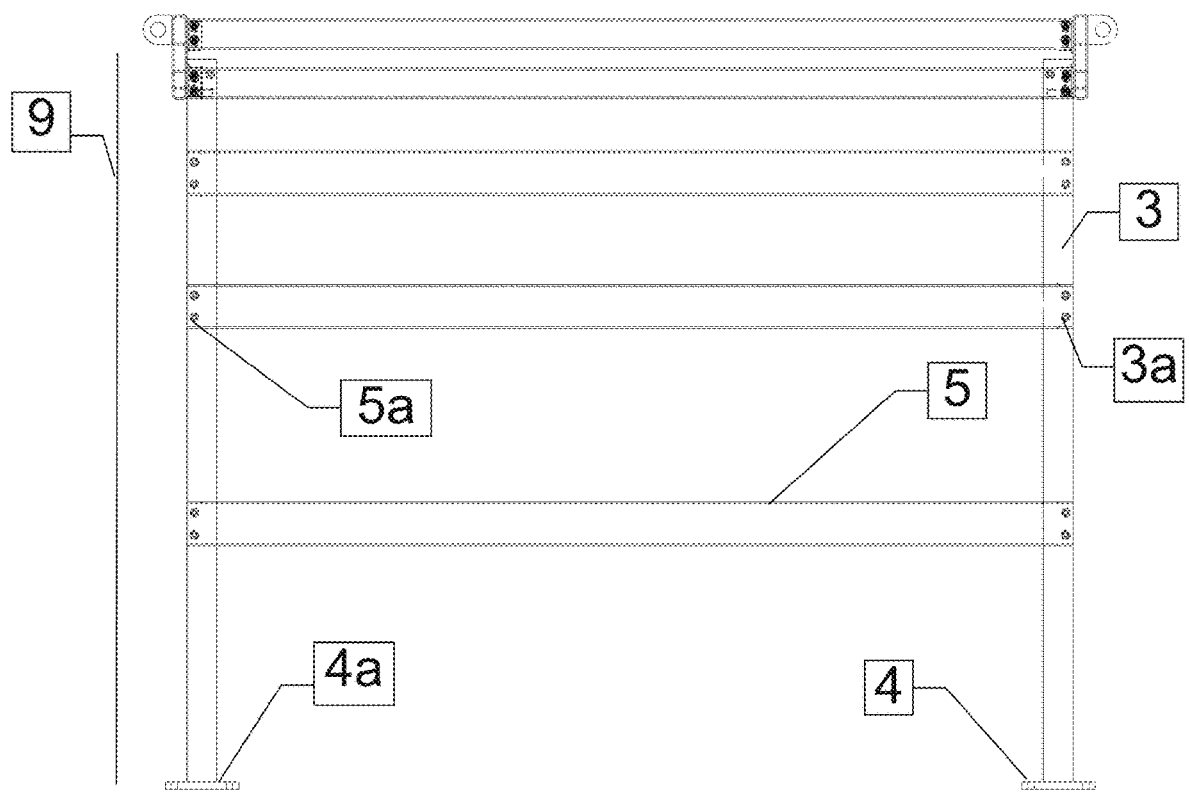
FIG. 8 is a front view of the alternate embodiment of the switch rack.

FIG. 3. Shows a front view of the switch rack 1. FIG. 8 shows a front view of the alternate embodiment of the switch rack 1. Most prominent in both figs. is the lower part 9. The differences between the lower 9 of FIGS. 3 and 8 are different lengths of their respective horizontal bars 5. Other than that, both embodiments are largely the same. The lower part 9 may suitably be comprised of a plurality of vertical bars 3 which feature base plates 4, and horizontal bars 5. In one mode of use, the lower part 9 may suitably be the component wherein IT infrastructure, such as switches, servers, cabling, or telecommunications equipment may be stored upon or upheld by the horizontal and vertical structures of the lower part 9. The lower part 9 may provide a frame for said infrastructure.

Still referring to FIGS. 3 and 8, the lower part 9 is preferably characterized by at least two vertical bars 3, which provide structural support for the horizontal bars 5. The vertical bars 3 may be preferably be I beams, but may also be c-channel bars. The vertical bar 3 may feature a base plate 4 on its lower end and a notch 3b on its upper end. The notch 3b shown is a triangular prism, however it may be another extruded shape, such as a square or a rectangle, so long as the notch 3b is configured so that it may sit flush with the attachment plate 12. The base plate 4 may provide stability to the entire switch rack 1. The base plate 4 may be square and may feature a plurality of holes. These base plate holes 4a may be used to attach the lower 9, and in turn the entire switch rack 1 into the ground. Attached to the vertical bar 3 there may be at least one horizontal bar 5. The horizontal bar 4 may provide support for the IT infrastructure. The horizontal bar 5 may be a c-channel bar, an I-beam, or a rectangular beam. The horizontal bar 5 shown in the figures is a c-channel bar. The horizontal bar 5 is attached to the vertical bar 3 by nuts 1b, bolts 1a, and through a correspondent hole layout.

The lower part 9 may be assembled by gathering all the parts which comprise the lower 9. This may include vertical bars 3, horizontal bars 5, nuts 1b, and bolts 1a. One may start by aligning a plurality of vertical bar holes 3a and a plurality of horizontal bar holes 5a. Once the holes 3a & 5a have been aligned on may pass a bolt 1a through the aligned holes. Thereafter on may screw a nut 1b onto the bolt 1a. This process may be repeated until all the vertical bars 3 have been affixed onto the horizontal bars 5. Once this has happened, the lower 9 may be fixed into the ground. The lower part 9 can be fixed to the ground via the base plate 4 which is attached, perhaps by weld, to the base of the vertical bar 3. In one use, such installation is done by drilling the base plate into the ground with bolts 1a via the base plate holes 4a.

Figure 4:
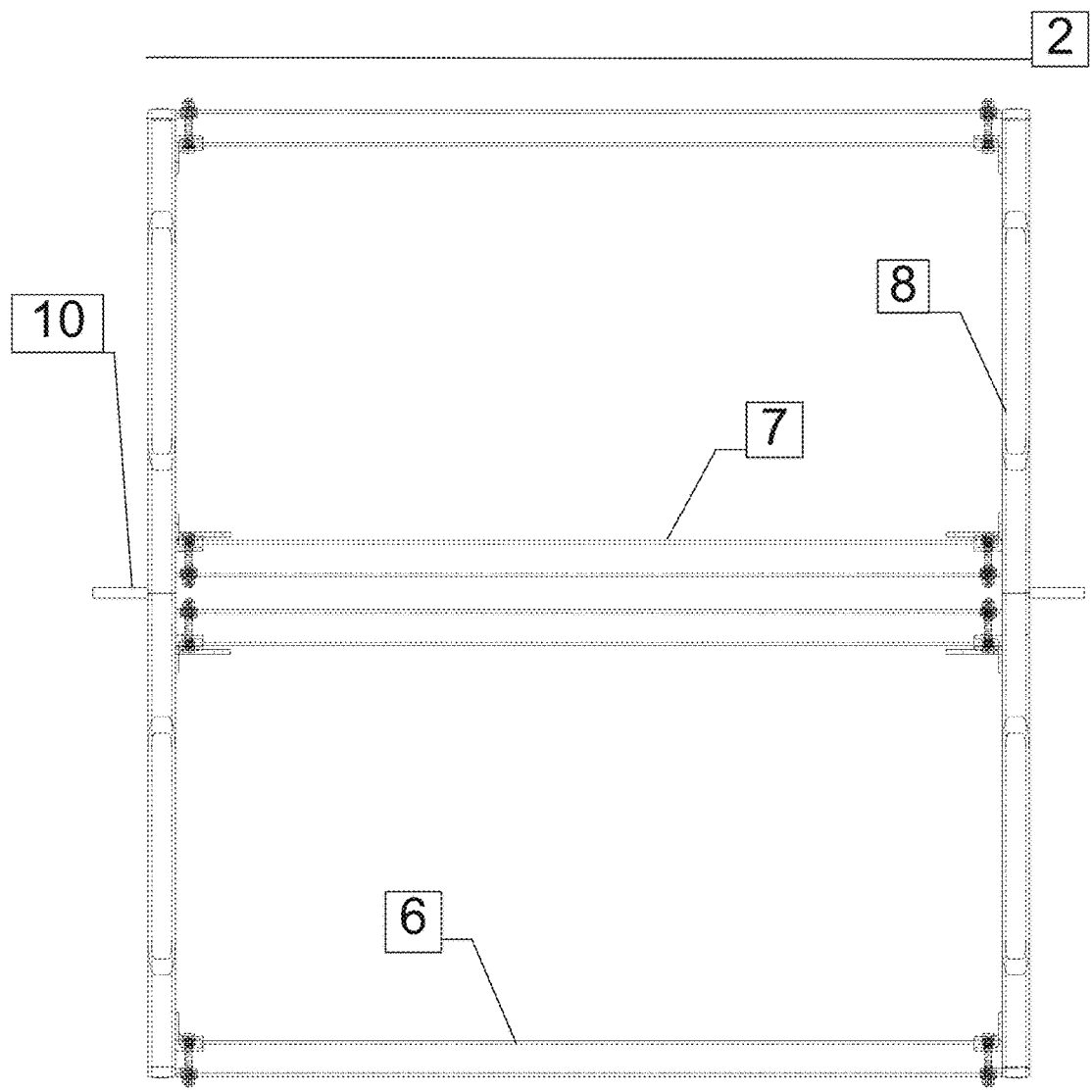
FIG. 4 is a top view of the switch rack.
Figure 9:
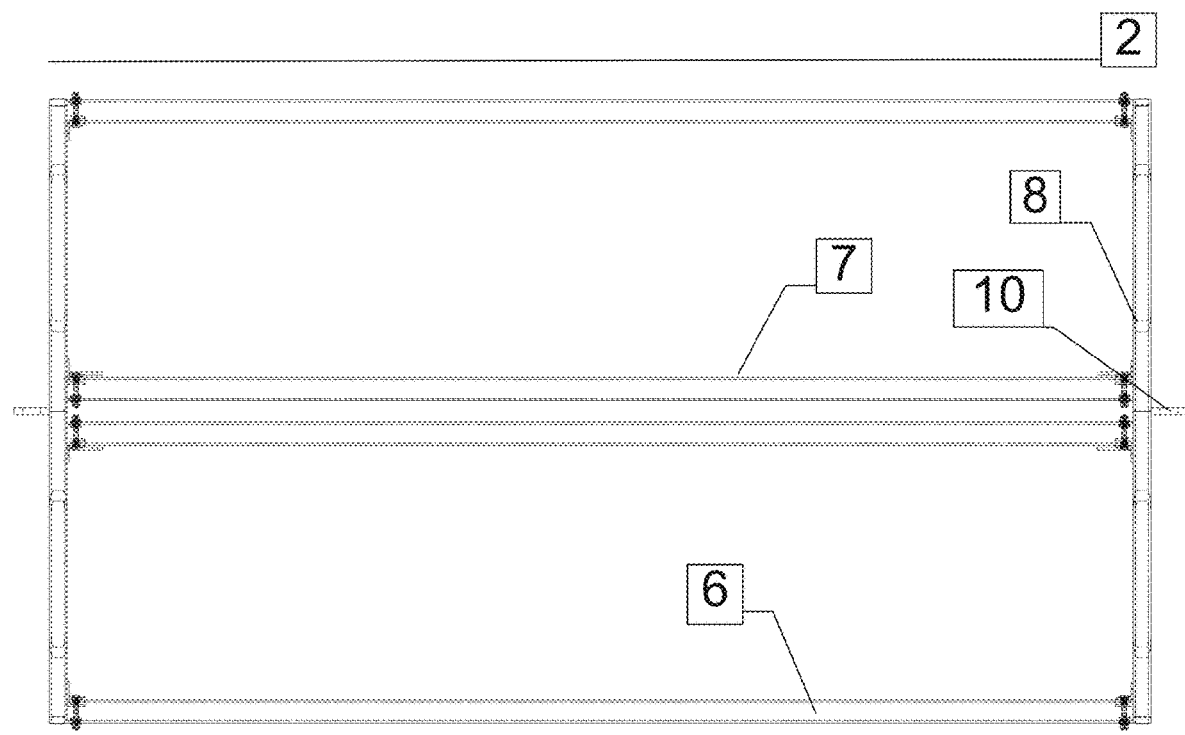
FIG. 9 is a top view of the alternate embodiment of the switch rack.

FIG. 4 shows a top view of the upper part 2. FIG. 9 shows a top view of the alternate embodiment of the upper part 2. One can clearly discern that the difference between the upper part 2 of FIG. 4 and the upper part 2 of FIG. 9, is that is that the upper part 2 of FIG. 9 features a plurality of longer components such as the strut 6 and the inner strut 7. Again, the two sizes of said parts are not limiting, as the sizes of the strut 6 and inner strut 7 can be customized to a particular job site or need of the user. In one embodiment, the switch rack 1 is often made to the order of a user. In is either case, the upper part 2 may provide protection for its stored goods from the elements, such as the sun, rain, or wind. This is achieved by the roof or awning like structure provided by the upper part 2. The roof like structure comes largely from the peaked and diagonal orientation of the slope bar 8. The upper part 2 may also feature at least one loop 10. FIGS. 4 & 9 show two loops 10 at opposite ends of the upper 2. The loop 10 may feature a through hole. It is attached to the upper part 2. These loops 10 may be used to hang or string different items such as cabling, wires, lights, or canopies from the upper part 2.

The upper part 2 may be assembled by gathering the components of the upper such as a wedge 11, the struts 6, slope bars 8, inner struts 7, loops 10, bolts 1a, and nuts 1b. One may start by aligning a plurality of inner strut holes 7a and a plurality of wedge holes 11a. The wedge 11 is an "L" shaped structure with a wedge hole 11a or hole layout on its outwardly protruding portion which is attached to the slope bar 8. The wedge 11 may be attached permanently to the slope bar 8 by welding or other means. Once the wedge holes 11a and inner strut holes 7a are aligned one may pass a plurality of bolts 1a though the inner strut holes 7a and the wedge holes 11a. Then one may screw a plurality of nuts 1b onto the plurality of bolts 1a. Shortly thereafter, one may repeat the same process for the inner is strut 7 and its respective slope bar 8 via the wedge 11. At this point, the only pieces missing from the upper 2 are the struts 6. Each strut 6 is added to the upper 2 individually. The strut 6 may be attached by aligning a plurality strut holes 6a and the plurality of wedge holes 11a. Once the strut holes 6a and the wedge holes 11a are aligned, bolts 1a may be passed through both holes 6a & 11a. Now, one may screw a nut 1b or plurality of nuts 1b onto the bolts 1a which have been passed through the holes. To add the strut 6 on the opposite side of the upper 2 the process of aligning strut holes 6a and wedge holes 11a, and attaching nuts 1b to bolts 1a once the bolts 1a have passed through the hole is repeated.

Figure 5:
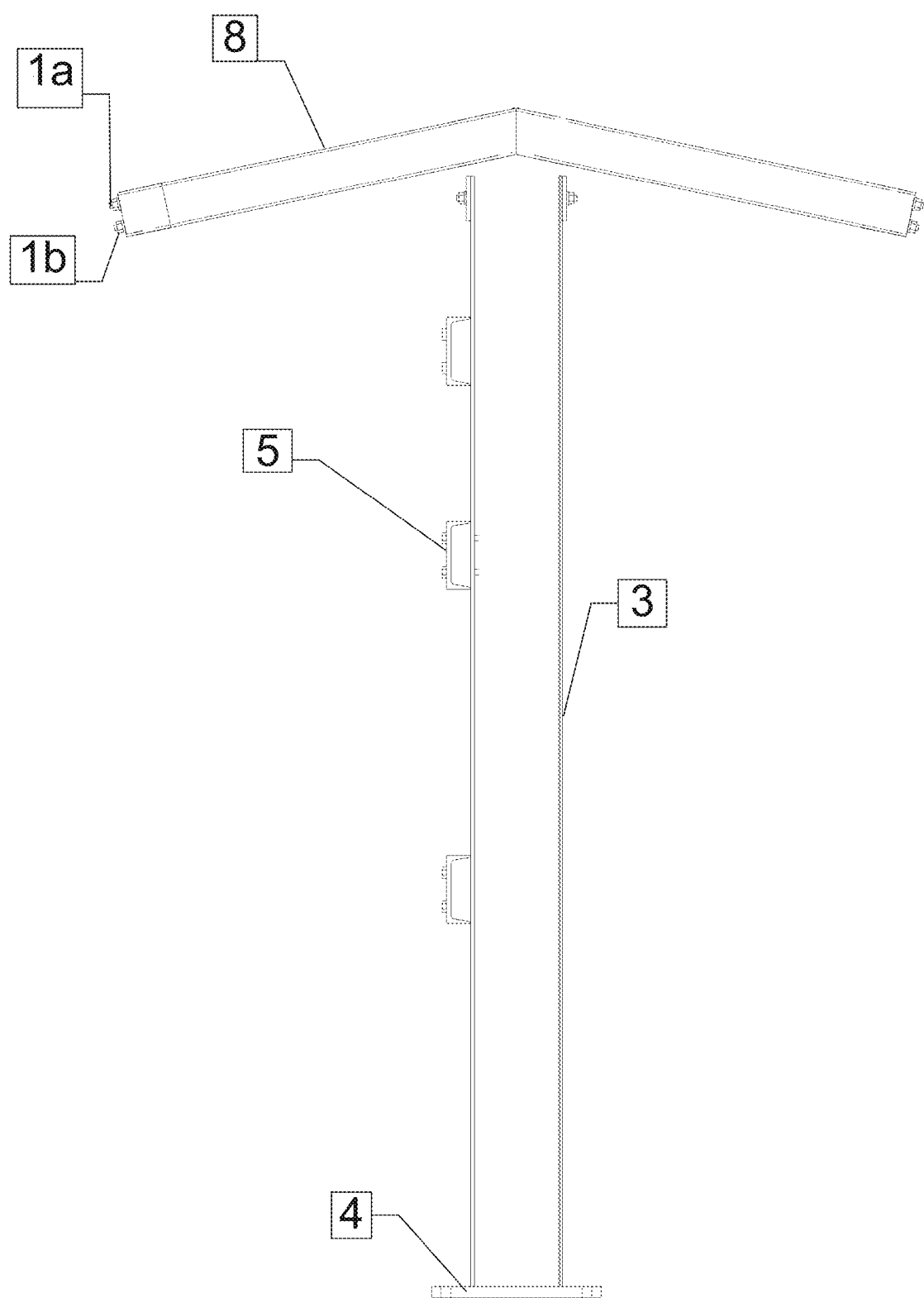
FIG. 5 is a side view of the switch rack.

FIG. 5 shows a side view of a switch rack 1. It should be noted that this side view may show both the preferred or alternate embodiments of the switch rack 1. As shown, the upper 2 displays a roof shape due to the peaked and diagonal orientation of the slope bar 8. From this view, one can see that the switch rack may be subtlety asymmetrical. This asymmetry comes from the horizontal bars 5 which may only be featured on one side of the switch rack 1.

Figure 10:
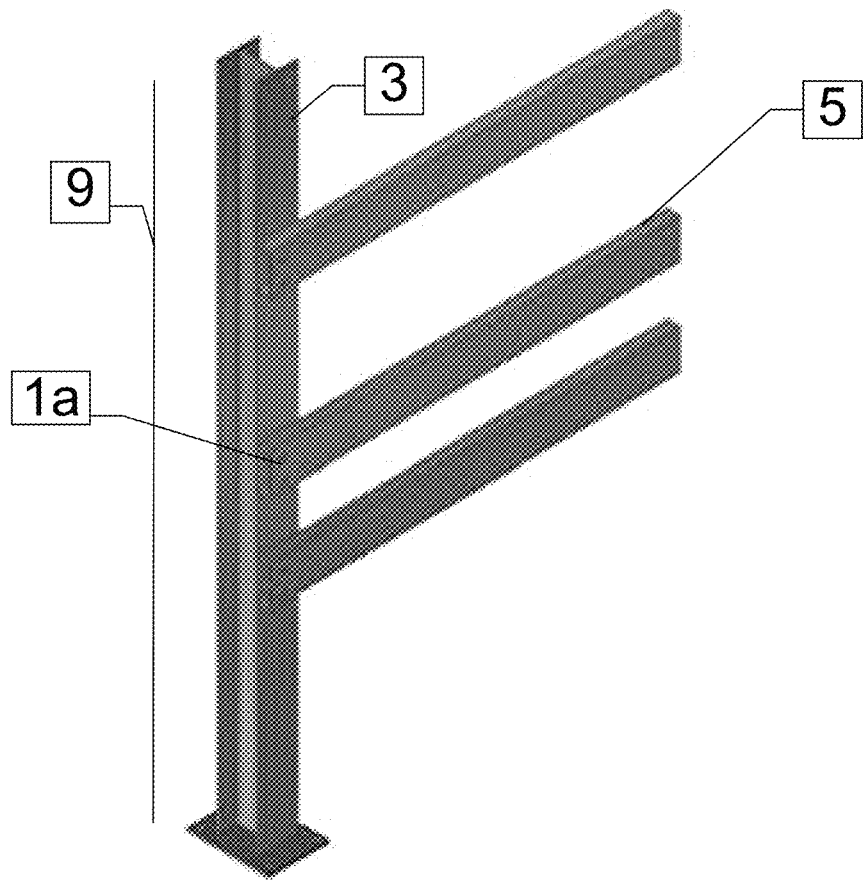
FIG. 10 is a perspective view of a partially assembled lower.
Figure 11:
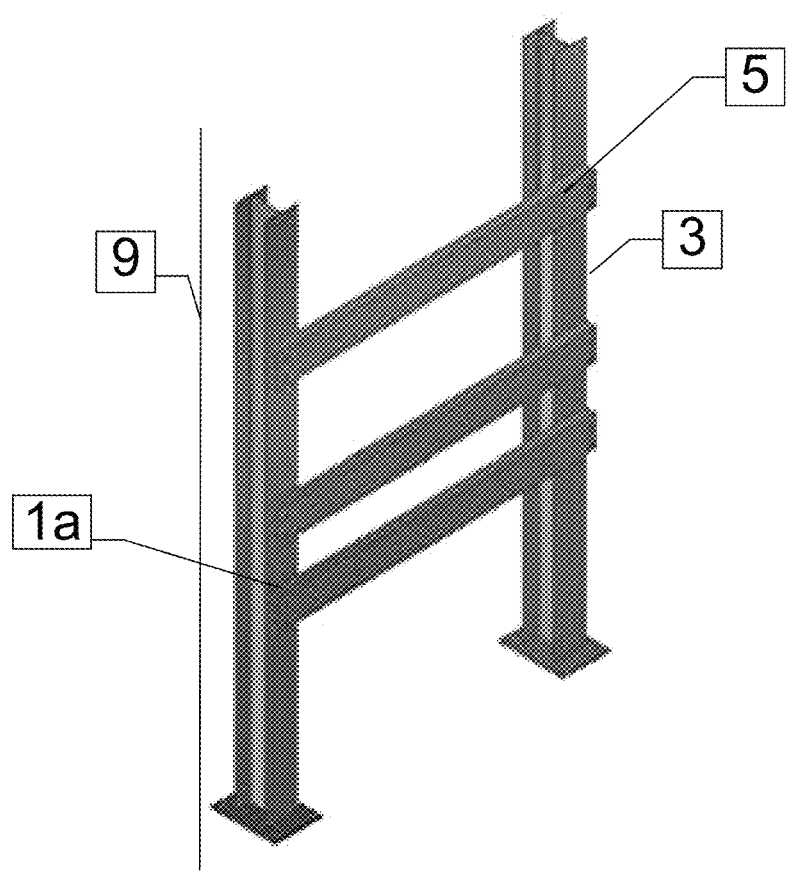
FIG. 11 is a perspective view of a partially assembled lower.
Figure 12:
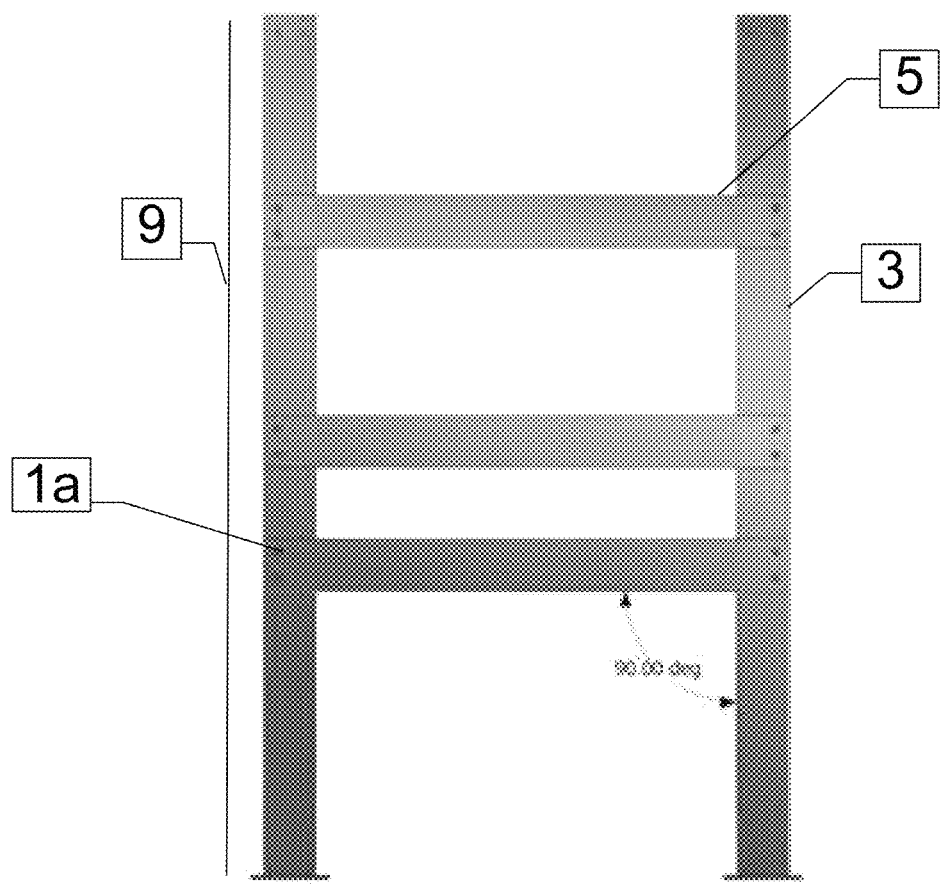
FIG. 12 is a front view of a partially assembled lower.
Figure 13:
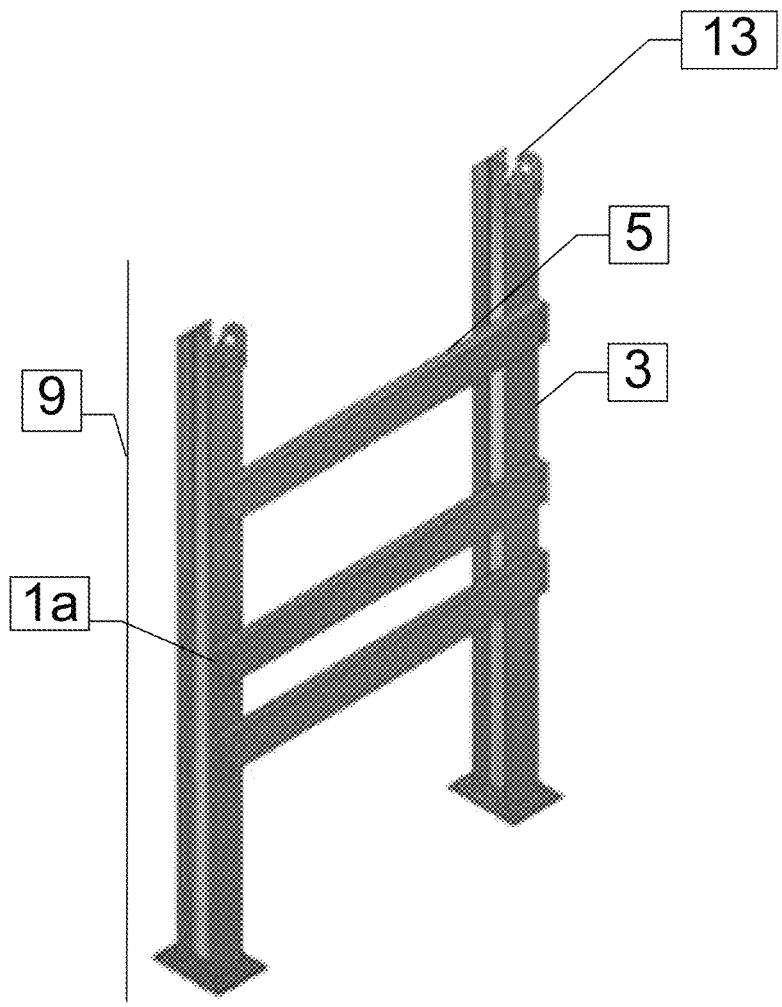
FIG. 13 is a perspective view of a partially assembled lower.
Figure 14:
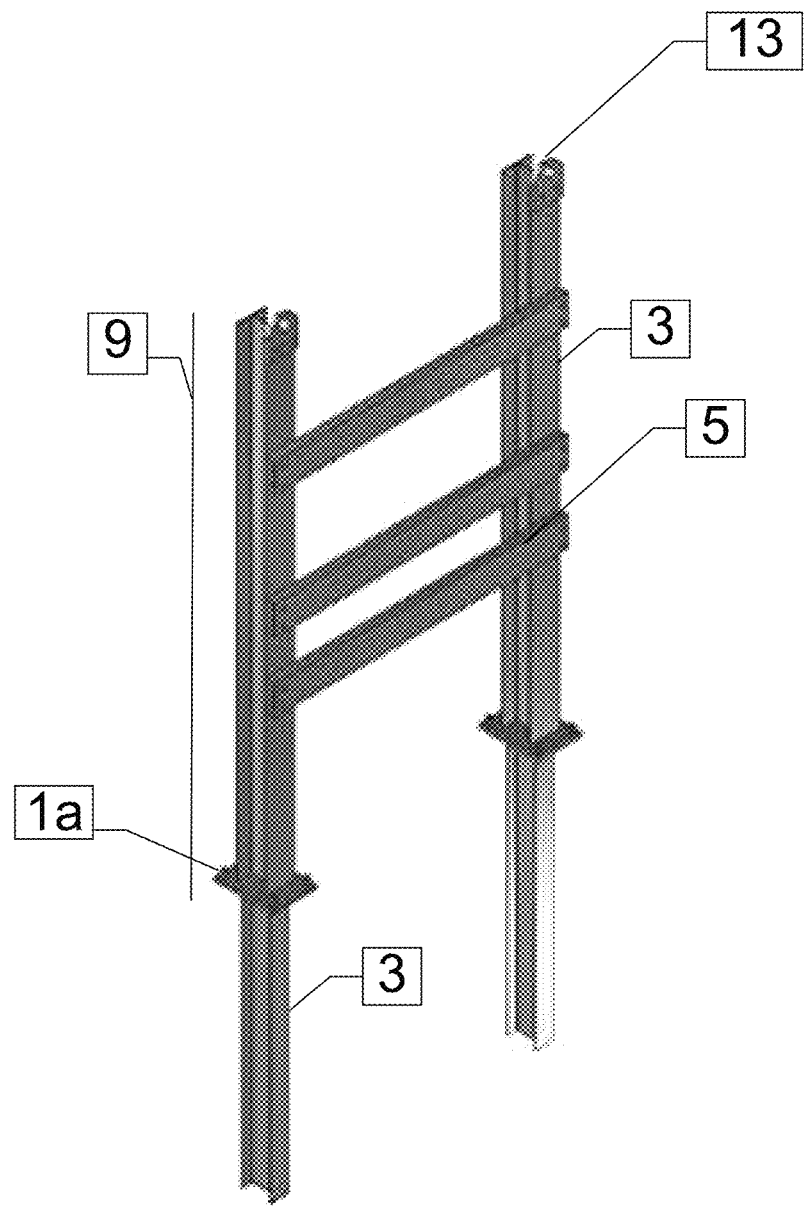
FIG. 14 is a perspective view of a partially assembled switch rack.

FIG. 10-20 demonstrate switch rack 1 construction and installation step by step. As shown in FIG. 10 one may start by assembling the lower 9. First, one may attach the horizontal bars 5 to a vertical bar 3 using ½" bolts 1a and tighten to finger tight. As shown in FIG. 11, attach the other vertical bar 3 to the opposite side of the horizontal bars 5 using ½" bolts 1a and tighten to finger tight. The next step, shown by FIG. 12 involves ensuring all vertical 3 and horizontal bars 5 are square and tightening the bolts 1a at the connection points to 75 ft-lbs. Then one may attach a plurality of temporary lifting lugs 13 to the top of the vertical bars 3 using ½" bolts 1a and tighten the bolts 1a to 75 ft-lbs, as shown in FIG. 13.

Figure 15:
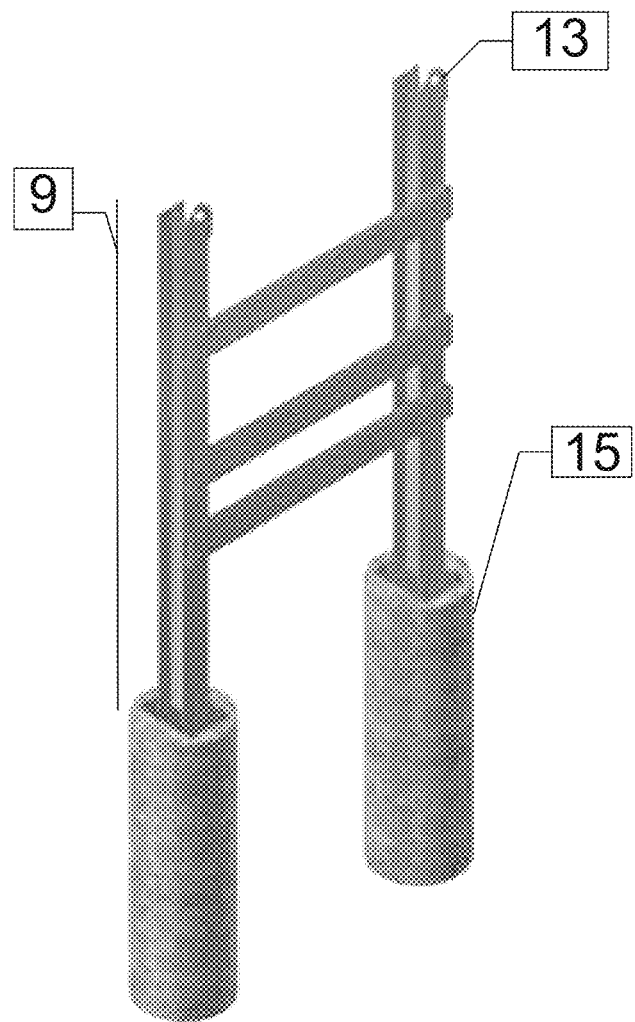
FIG. 15 is a perspective view of a partially assembled switch rack.
Figure 16:
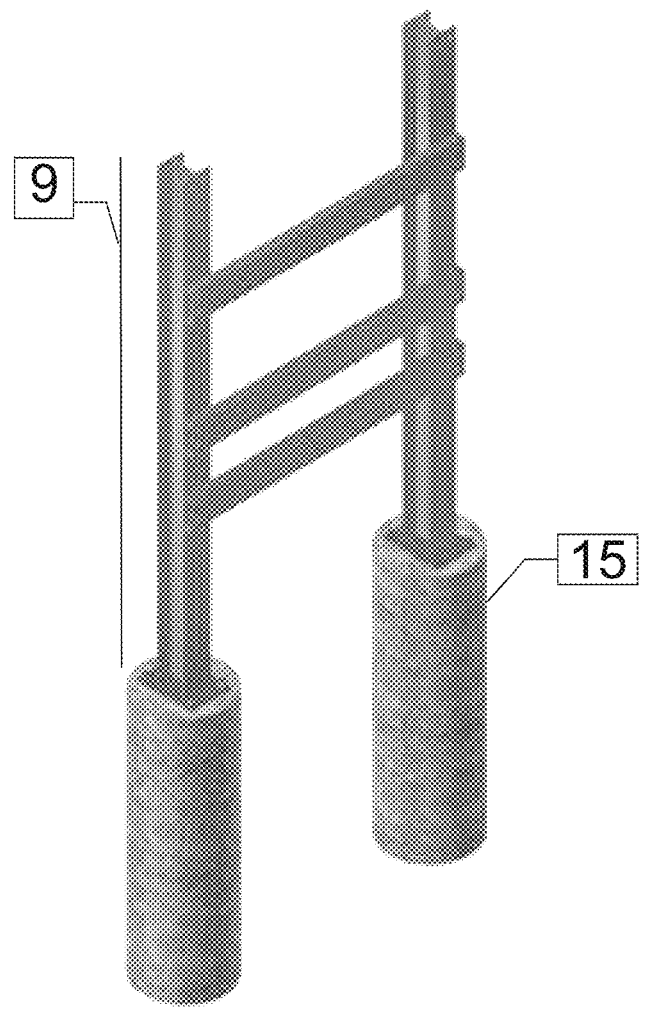
FIG. 16 is a perspective view of a partially assembled switch rack.

Now that the lower 9 is built one must determine how to secure it to a jobsite. Three options for securing the lower 9 are by using A) a plurality of concrete piers 15 with ½" diameter by 15" anchors, B) concrete piers 15 with embedded base plates 4 and bolts 1a, and C) soil mount using feet. It should be noted that option C requires installation specific civil engineering. For purposes of illustration and example one may choose option B (shown by FIG. 14) wherein one may attach the base plates 4 of the vertical bars 3 that comprise the upper 2 to the base plates 4 of two other vertical bars 3 using ¾" bolts 1a. Then one may tighten the bolts 1a to 175 ft-lbs. For purpose of another example or illustration, as shown by FIG. 15, one may secure the lower 9 into the concrete piers 15 via the newly attached vertical bars 3. The following step, shown in FIG. 16, involves removing the lifting lugs 13 from the vertical bars 3.

Figure 17:
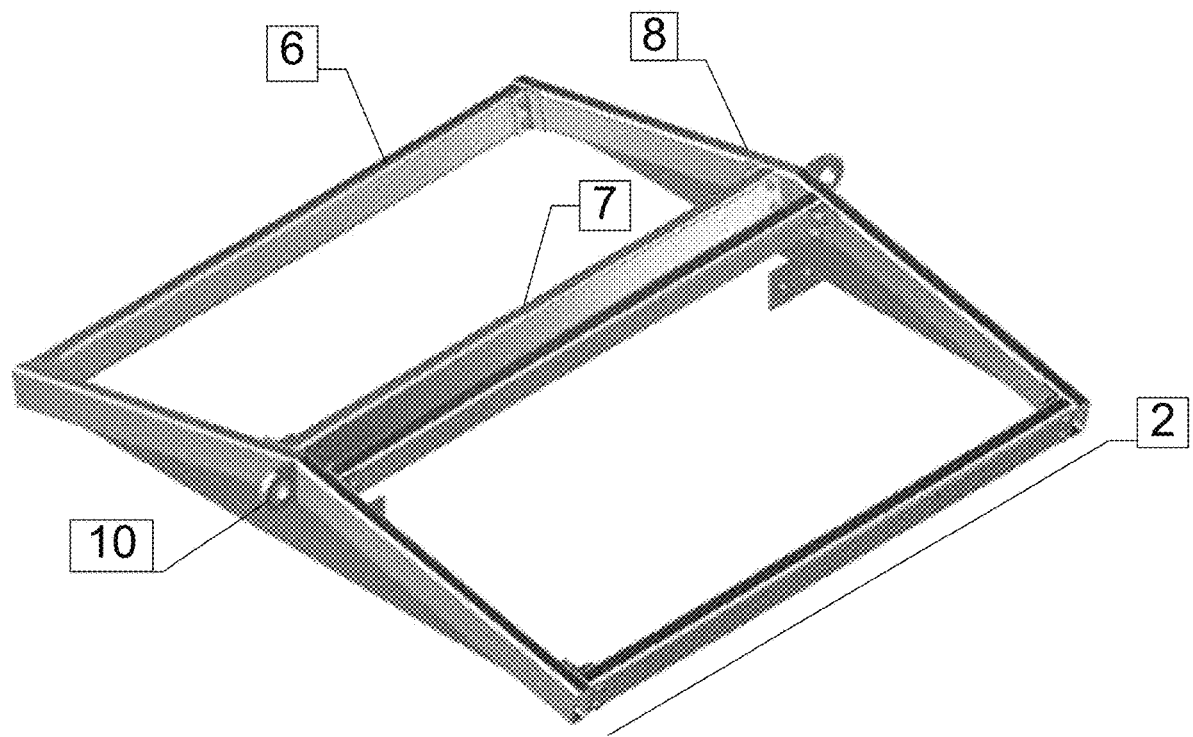
FIG. 17 is a perspective view of a partially assembled upper.
Figure 18:
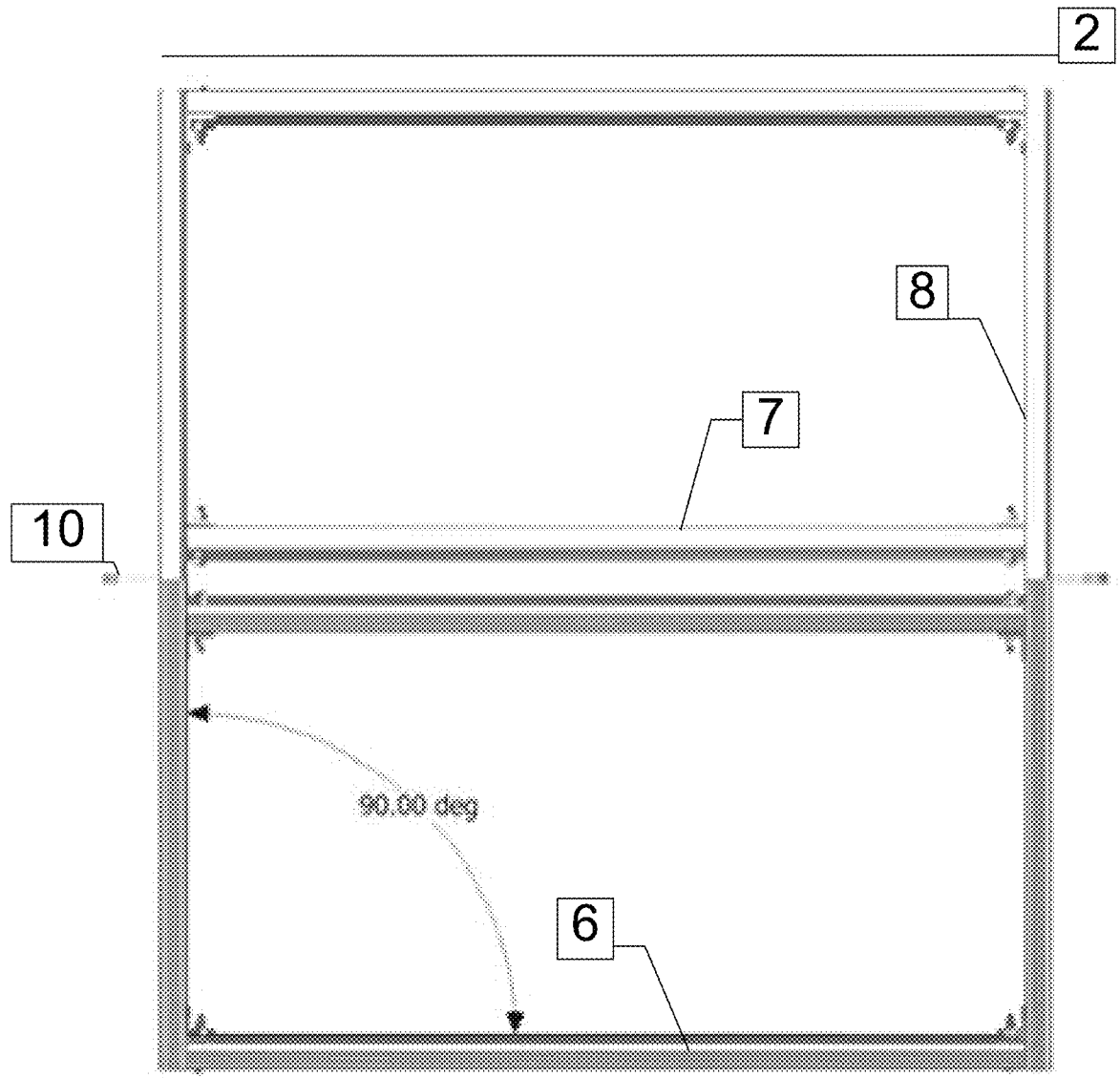
FIG. 18 is a front view of a partially assembled upper.
Figure 19:
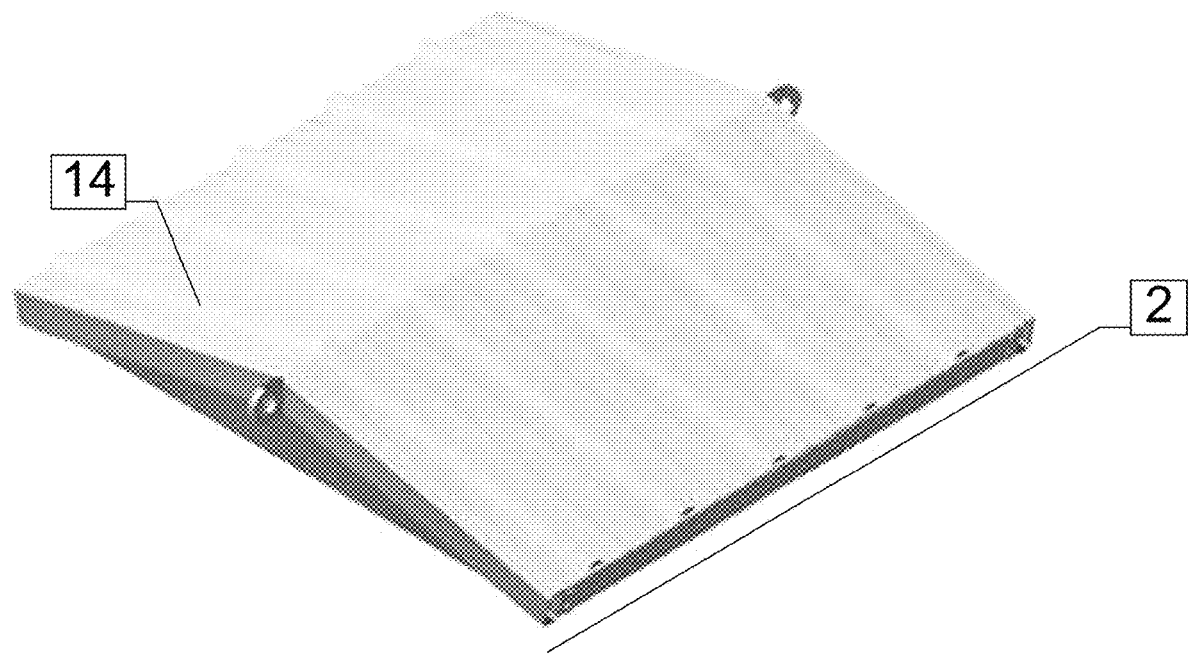
FIG. 19 is a perspective view of an upper.
Figure 20:
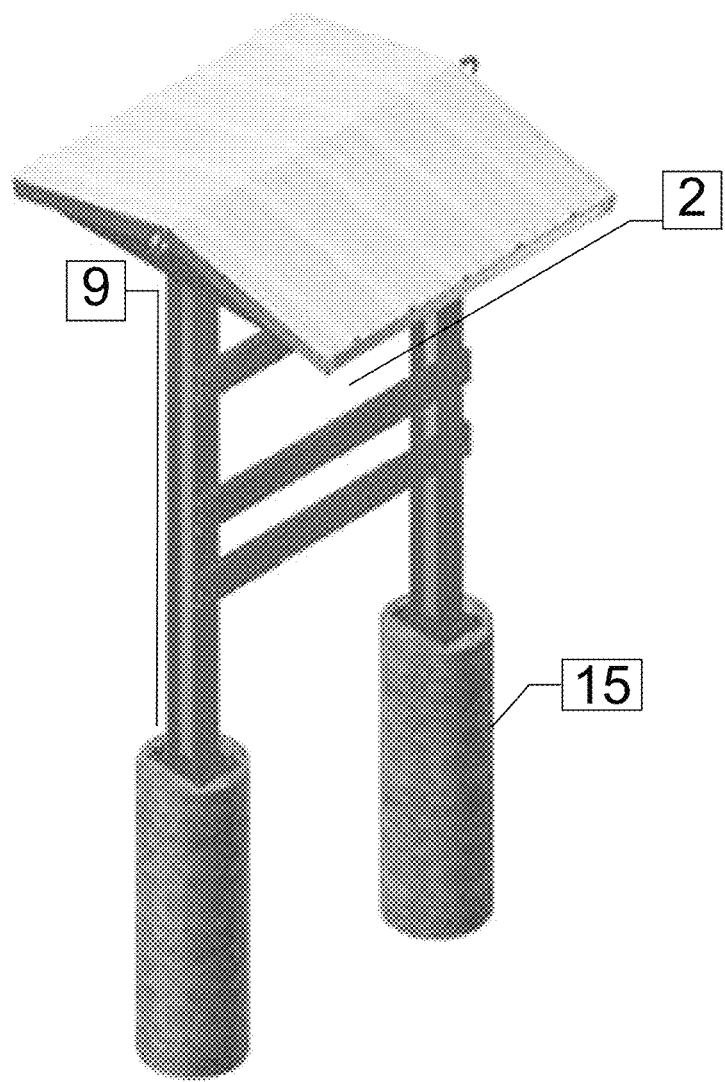
FIG. 20 is a perspective view of a switch rack.

With the lower 9 built and secured, all that remains to be done is to assemble and attach the upper 2. To begin, one may assemble the upper 2 as shown by FIG. 17. This is done by attaching the struts 6, inner struts 7, slope bars 8, loops 10, and attachment plates 12 using ½" bolts 1a and then tightening the bolts 1a to finger tight. Next, as shown by FIG. 18, one may ensure all components are square and tighten the bolts 1a to 75 ft-lbs. The following step is shown by FIG. 19. Now that the structure of the upper 2 is in place one may attach a plurality of pre-drilled roofing panels 14 to the upper 2. As shown in FIG. 20, one may now attach the upper 2 and the lower 9 then place bolts 1a and tighten the bolts 1a to 75 ft-lbs.

Although the method and apparatus is described above in terms of various exemplary embodiments and implementations, it should be understood that the various features, aspects and functionality described in one or more of the individual embodiments are not limited in their applicability to the particular embodiment with which they are described, but instead might be applied, alone or in various combinations, to one or more of the other embodiments of the disclosed method and apparatus, whether or not such embodiments are described and whether or not such features are presented as being a part of a described embodiment. Thus the breadth and scope of the claimed invention should not be limited by any of the above-described embodiments.

Terms and phrases used in this document, and variations thereof, unless otherwise expressly stated, should be construed as open-ended as opposed to limiting. As examples of the foregoing: the term "including" should be read as meaning "including, without limitation" or the like, the term "example" is used to provide exemplary instances of the item in discussion, not an exhaustive or limiting list thereof, the terms "a" or "an" should be read as meaning "at least one," "one or more," or the like, and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that might be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances is shall not be read to mean that the narrower case is intended or required in instances where such broadening phrases might be absent. The use of the term "assembly" does not imply that the components or functionality described or claimed as part of the module are all configured in a common package. Indeed, any or all of the various components of a module, whether control logic or other components, might be combined in a single package or separately maintained and might further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives might be implemented without confinement to the illustrated examples. For example, block diagrams and their accompanying description should not be construed as mandating a particular architecture or configuration.

All original claims submitted with this specification are incorporated by reference in their entirety as if fully set forth herein.

We claim:

1. A switch rack (1) comprising: an upper (2) comprised of a plurality of outer struts (6), a plurality of inner struts (7), and a plurality of slant bars; and, a lower (9) wherein the lower (9) is comprised of two vertical bars (3), wherein an upper end of each of the two vertical bars (3) features a triangular prism shaped notch (3b), and three horizontal bars (5), wherein the two vertical bars (3) are I beams and made of aluminum and the three horizontal bars are c-channel bars made of aluminum, the two vertical bars (3) and the three horizontal bars (5) are mated by passing twelve bolts (1a) through twelve vertical bar holes (3a), arranged with six vertical bar holes (3a) on each of the two vertical bars (3), and twelve horizontal bar holes (5a), arranged with two horizontal bar holes (5a) on each end of the three horizontal bars (5), and then using twelve threaded nuts (1b) to secure said two vertical (3) and three horizontal bars (5) in place at connection points to exactly 75 ft-lbs.

2. The switch rack (1) of claim 1 wherein the lower (9) is secured to the ground by passing eight ½" bolts (1a) through four base plate holes (4a) in each of two square base plates (4), which are secured to the bottoms of the vertical bars by weld.

3. A method of setting up and operating a switch rack (1) in the field comprising: obtaining a lower (9) comprising: two vertical bars (3), wherein an upper end of the two vertical bars (3) features a triangular prism shaped notch (3b), and three horizontal bars (5), wherein the two vertical bars (3) are I beams and made of aluminum and the three horizontal bars are c-channel bars made of aluminum, placing the lower (9) on the ground passing eight ½" bolts (1a) through base plate holes (4a) in two square base plates (4) of the lower (9), wherein the two square base plates (4) are attached to a lower end of each of the two vertical bars (3) by weld; placing switches on the switch rack (1) and, hanging lights, canopy, and cabling from the switch rack (1) via a loop (10).

4. The method of setting up and operating a switch rack (1) in the field of claim 3 further comprising bolting an upper (2) comprising a wedge (11), struts (6), slope bars (8), inner struts (7), loops (10), bolts (1a), and nuts (1b) to the lower a via an attachment plate (12), wherein the wedge (11) is permanently fixed to the slope bars (8) via welding and comprises wedge holes (11a) which permit the wedge (11) to be affixed to the struts (6) via the inner strut holes (6a) with ½" bolts (1a) and nuts (1b) which are tightened to 75 ft-lbs.

5. The method of setting up and operating a switch rack (1) in the field of claim 4 wherein at least one attachment plate hole (12a) is aligned with at least one vertical bar hole (3a) by the triangular prism-shaped notch (3b), such that a nut (1b) and a bolt (1a) may be threaded through the holes (12a, 3b) such that the upper (2) and the lower (9) are affixed to each other.

* * * * *